(12) United States Patent
Robinson, Jr.

(10) Patent No.: US 11,108,397 B2
(45) Date of Patent: Aug. 31, 2021

(54) FIBER-OPTIC CONNECTED LOGIC (FOCL)

(71) Applicant: Kay C. Robinson, Jr., Detroit, MI (US)

(72) Inventor: Kay C. Robinson, Jr., Detroit, MI (US)

(*) Notice: Subject to any disclaimer, the term of this patent is extended or adjusted under 35 U.S.C. 154(b) by 0 days.

(21) Appl. No.: 16/681,744

(22) Filed: Nov. 12, 2019

(65) Prior Publication Data
US 2020/0083887 A1   Mar. 12, 2020

Related U.S. Application Data

(63) Continuation-in-part of application No. 15/932,565, filed on Mar. 13, 2018, now abandoned.

(51) Int. Cl.
| | |
|---|---|
| *H03K 19/082* | (2006.01) |
| *H03K 19/094* | (2006.01) |
| *H01L 25/16* | (2006.01) |
| *G02B 6/38* | (2006.01) |

(52) U.S. Cl.
CPC ......... *H03K 19/082* (2013.01); *G02B 6/3825* (2013.01); *H01L 25/167* (2013.01); *H03K 19/094* (2013.01)

(58) Field of Classification Search
CPC .......................... H03K 19/082; H03K 19/094
See application file for complete search history.

(56) References Cited

U.S. PATENT DOCUMENTS

| | | | | |
|---|---|---|---|---|
| 5,969,581 A | * | 10/1999 | Hart ..................... | H03C 7/025 333/258 |
| 2017/0099111 A1 | * | 4/2017 | Asmanis et al. ....... | H03C 7/025 333/258 |

FOREIGN PATENT DOCUMENTS

EP     0691742 A2 *   1/1996   ........... H03K 17/785

\* cited by examiner

*Primary Examiner* — Charlie Y Peng

(57) ABSTRACT

Within the integrated circuit there are a significant number of components and not all of them are electronic switches. In an effort to increase data speeds, lower power consumption, simplify circuits increase functionality within the integrated circuit, and increase the overall processing power of the circuit chip the use fiber-optic transmission lines as a communication medium between logic circuits instead of metallic conductors is more effective when utilized within the circuit chip. This would be used purely for the transmission of data and communication. With fiber-optic transmission lines, microscopic LED's and photodiode's the electronic/electrical design of logic gates would become simpler, there would be faster communication, less corrupted data, and a longer lifespan for the semiconductor circuit chips that are data processors.

8 Claims, 8 Drawing Sheets

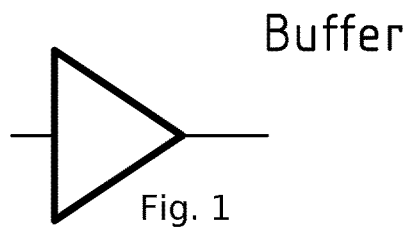
Fig. 1
| A | Y |
|---|---|
| 0 | 0 |
| 1 | 1 |
Fig. 1a
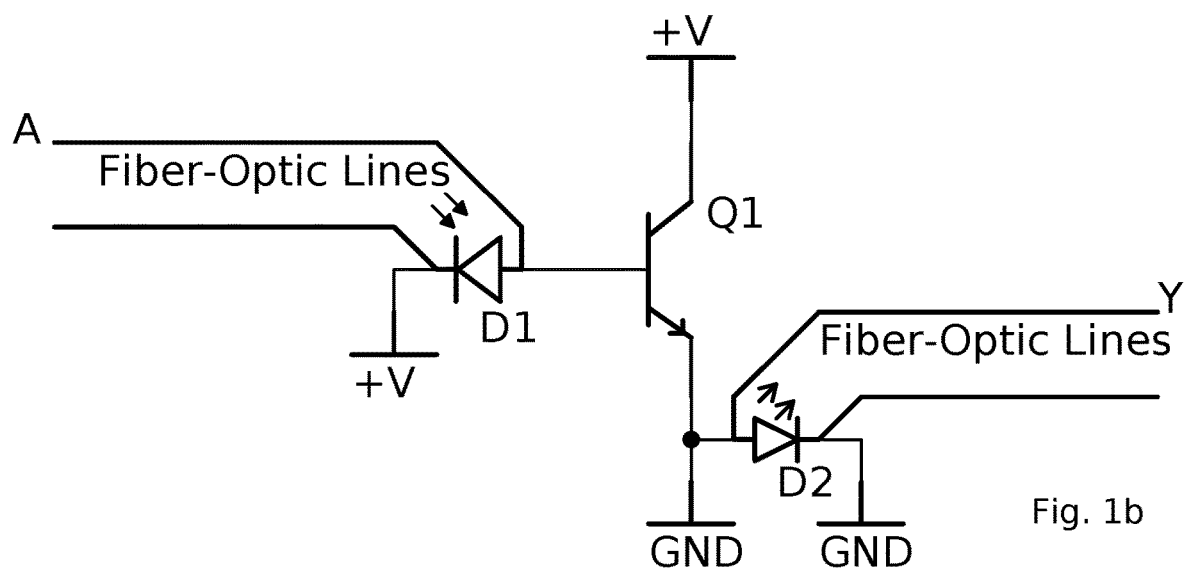
Fig. 1b
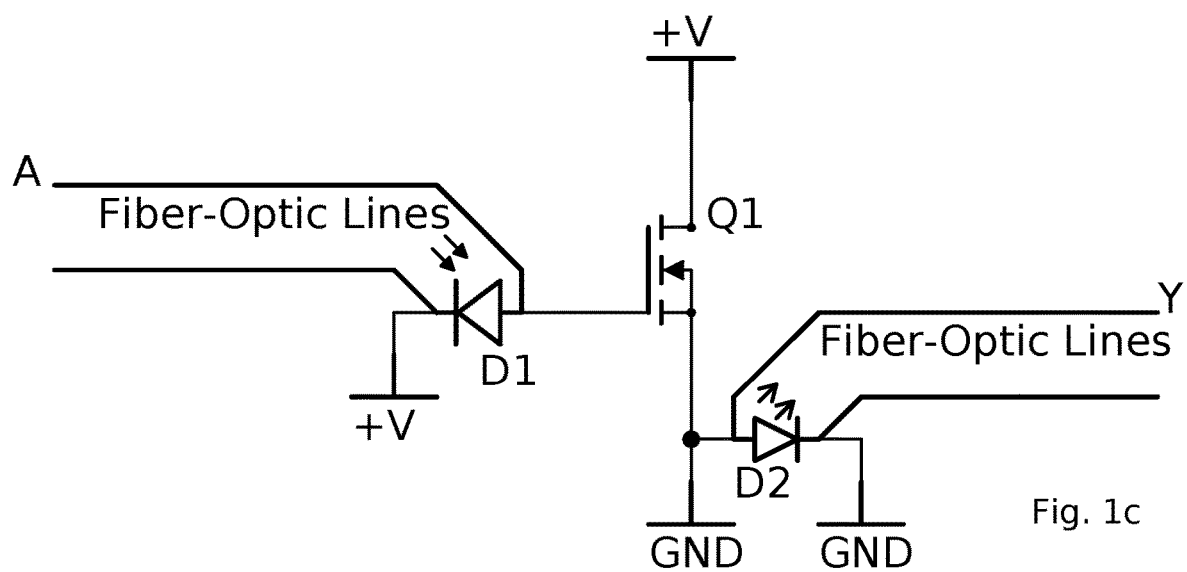
Fig. 1c

Fig. 2 AND Gate

| A | B | Y |
|---|---|---|
| 0 | 0 | 0 |
| 0 | 1 | 0 |
| 1 | 0 | 0 |
| 1 | 1 | 1 |

OR Gate
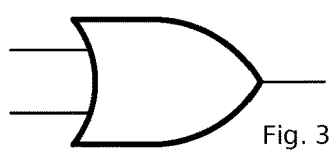
Fig. 3
| A | B | Y |
|---|---|---|
| 0 | 0 | 0 |
| 0 | 1 | 1 |
| 1 | 0 | 1 |
| 1 | 1 | 1 |
Fig. 3a
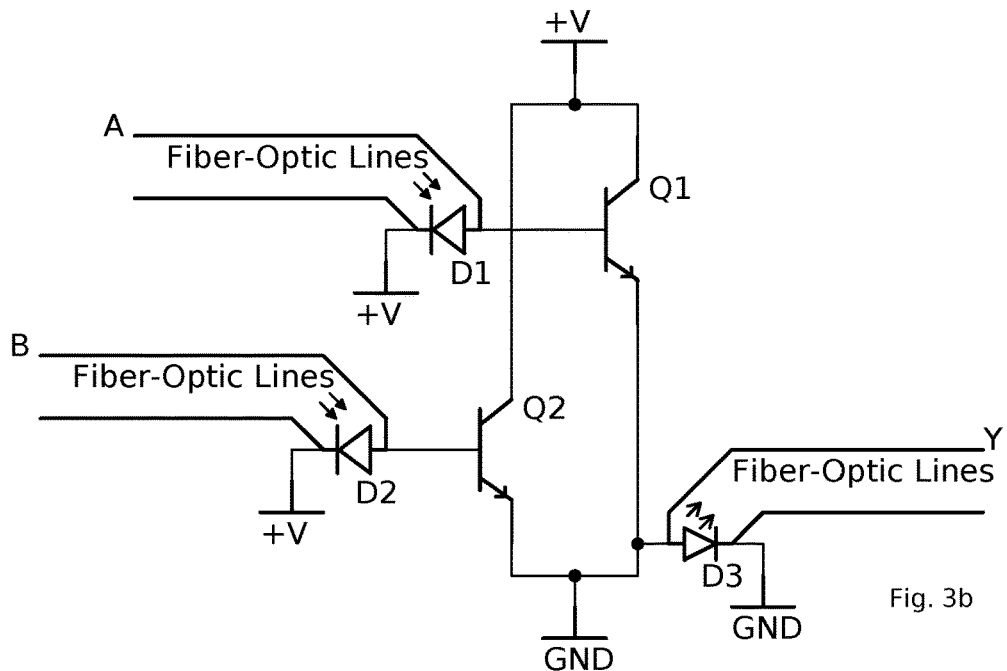
Fig. 3b
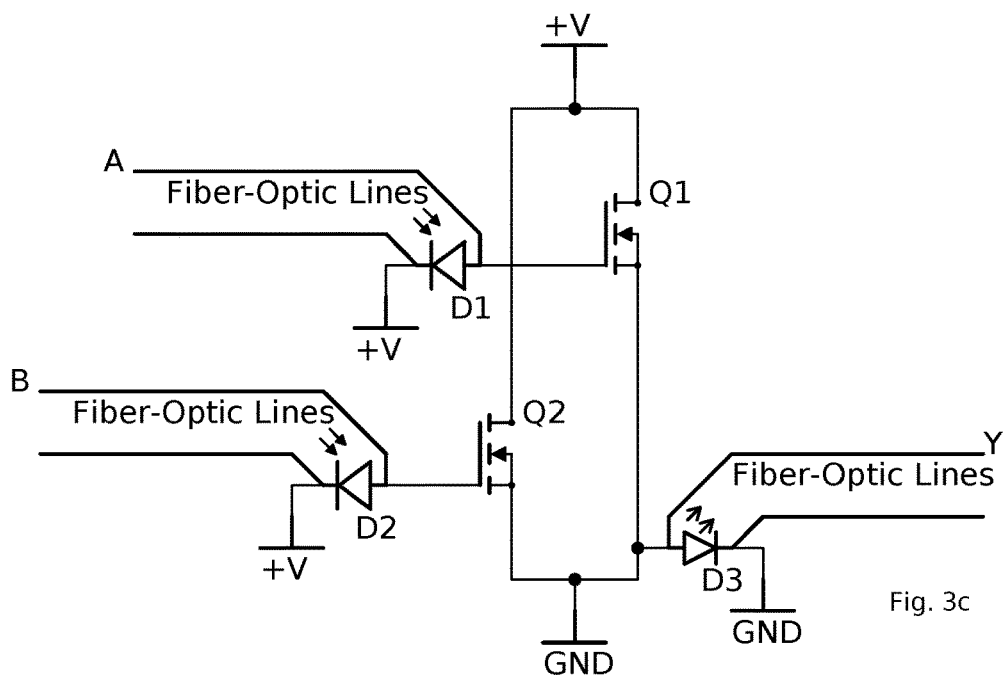
Fig. 3c

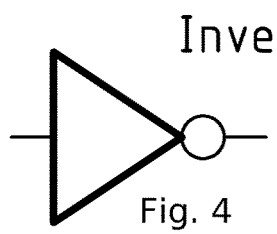
Inverter (NOT Gate)
Fig. 4
| A | Y |
|---|---|
| 0 | 1 |
| 1 | 0 |
Fig. 4a
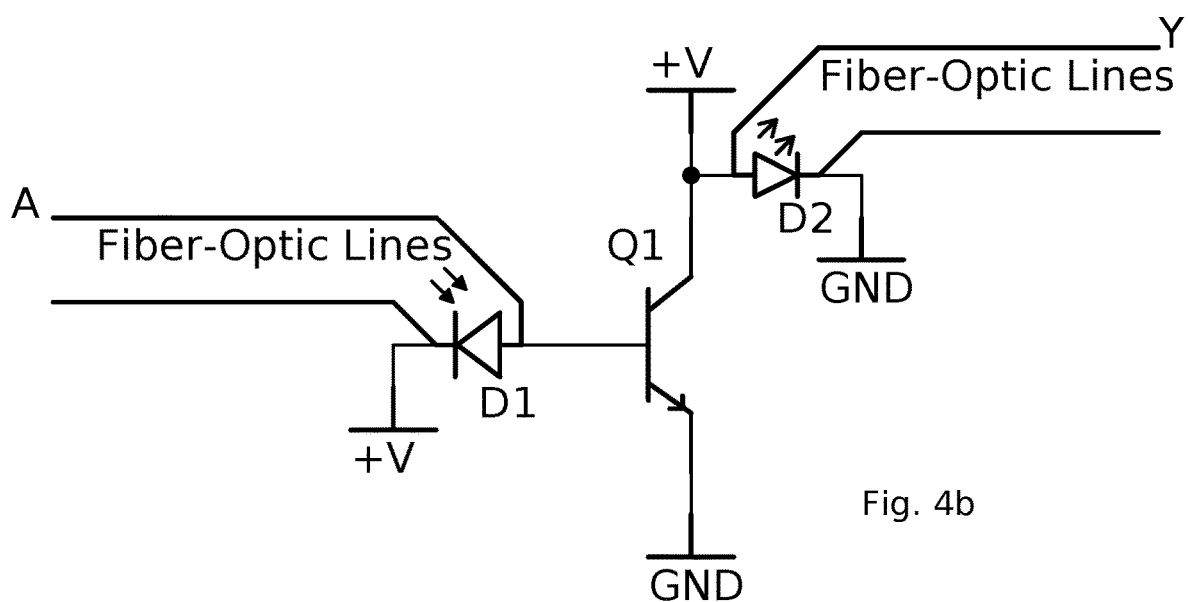
Fig. 4b
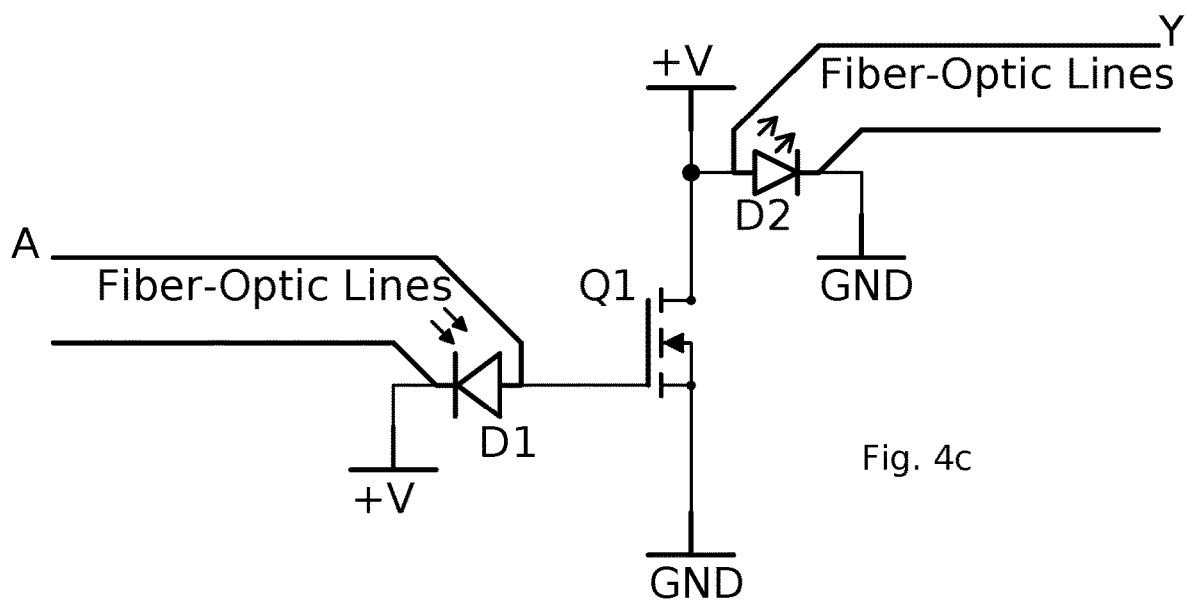
Fig. 4c

Fig. 5 NAND Gate

| A | B | Y |
|---|---|---|
| 0 | 0 | 1 |
| 0 | 1 | 1 |
| 1 | 0 | 1 |
| 1 | 1 | 0 |

NOR Gate
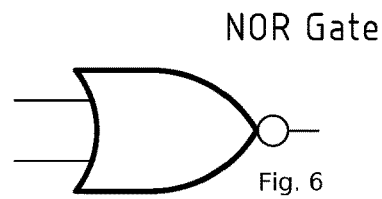
Fig. 6
| A | B | Y |
|---|---|---|
| 0 | 0 | 1 |
| 0 | 1 | 0 |
| 1 | 0 | 0 |
| 1 | 1 | 0 |
Fig. 6a
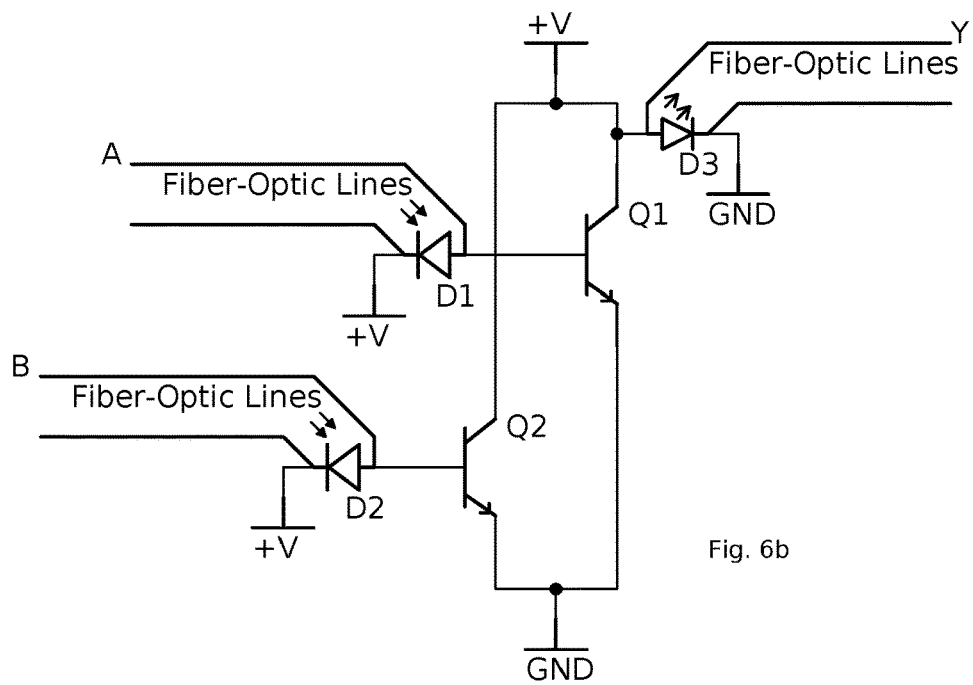
Fig. 6b
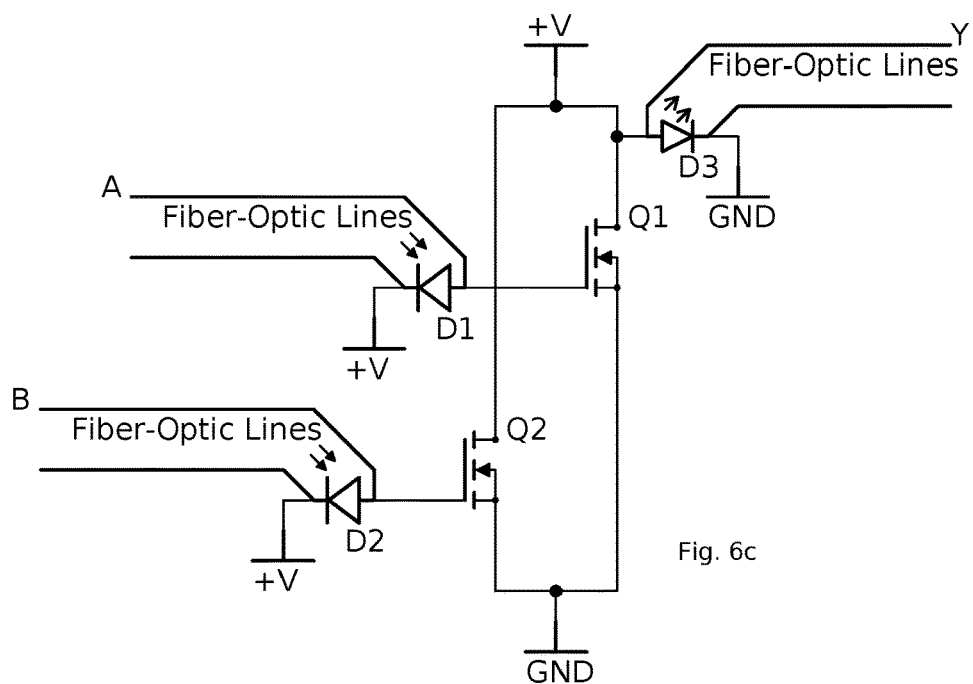
Fig. 6c

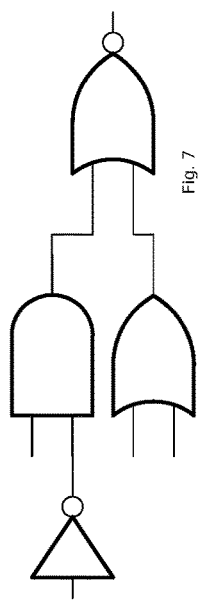
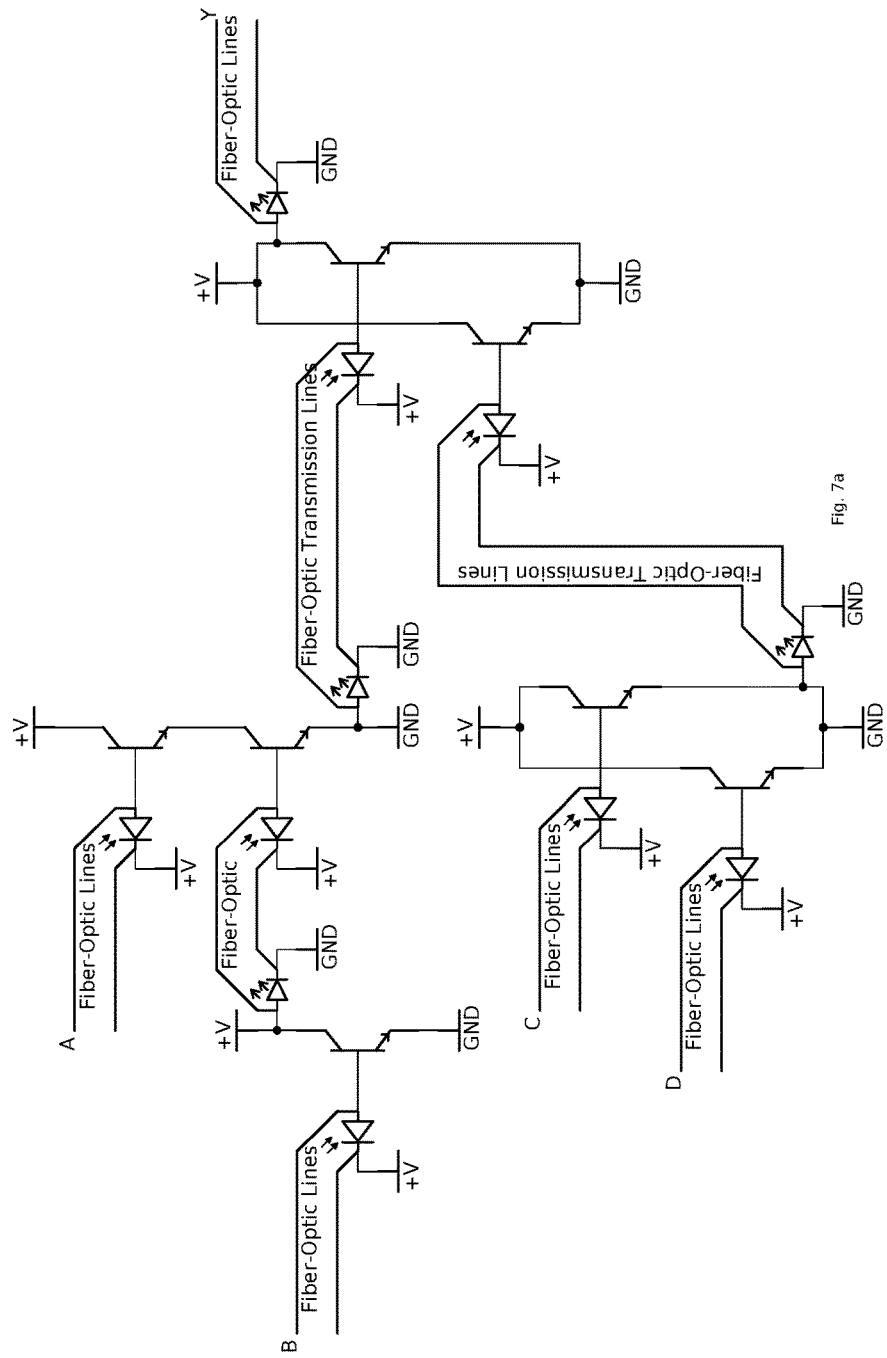

US 11,108,397 B2

FIBER-OPTIC CONNECTED LOGIC (FOCL)

BACKGROUND OF THE INVENTION

The present invention is an electronic circuit design method that incorporates fiber optic lines between individual logic gates for transmitting data. Using fiber optics as data transmission between logic circuits would make a simplified logic circuit construction best. Although the design of any logic circuit does not necessarily have to follow this or any suggested design the use of fiber optics for transmitting data between the logic gates is the core of this design method. What's important is the function of the desired circuit. For this reason, schematic symbols are used in electrical, electronic, and computer engineering to represent small complete circuits that have known function. As long as the design proves the truth table, that is associated with that particular logic circuit, correct then the circuit works.

SUMMARY OF THE INVENTION

Each transistor and diode has what is called a propagation delay. This is the amount of time the transistor or diode takes to go from on to off and vice versa. Realizing this the more electronic switches used in a particular device the slower the circuit will be in performing the appropriate function. Using fiber optics to transmit data between logic gates increases the speeds and provides other benefits as well such as lower power consumption and lower possibility of faulty information being transmitted and received. This invention is primarily intended for data transmission and not for power amplification, transformation, or the increasing or decreasing of voltage.

BRIEF DESCRIPTION OF THE DRAWINGS

FIG. 1 illustrate the schematic symbol for the buffer circuit.
FIG. 1a illustrates the truth table for the buffer circuit.
FIG. 1b illustrates the buffer circuit using a single BJT transistor.
FIG. 1c illustrates the buffer circuit using a single FET transistor.
FIG. 2 illustrates the schematic symbol for the AND gate circuit.
FIG. 3 illustrates the schematic symbol for the OR gate circuit.
FIG. 3a illustrates the truth table for the OR gate circuit.
FIG. 3b illustrates the OR gate circuit using two BJT's connected in parallel.
FIG. 3c illustrates the OR gate circuit using two FET's connected in parallel.
FIG. 4 illustrates the schematic symbol for the inverter or NOT gate circuit.
FIG. 4a illustrates the truth table for the inverter or NOT gate circuit.
FIG. 4b illustrates the inverter or NOT gate circuit using a single BJT.
FIG. 4c illustrates the inverter or NOT gate circuit using a single FET.
FIG. 5 illustrates the schematic symbol for the NAND gate circuit.
FIG. 6 illustrates the schematic symbol for the NOR gate circuit.
FIG. 6a illustrates the truth table for the NOR gate circuit.
FIG. 6b illustrates the NOR gate circuit using two BJT's connected in parallel.
FIG. 6c illustrates the NOR gate circuit using two FET's connected in parallel.
FIG. 7 illustrates a circuit design using the schematic symbols for the logic gate circuits.
FIG. 7a illustrates a detailed schematic of how the logic gates would connect to each other using BJT transistors.

DETAILED DESCRIPTION

The schematic symbols in FIG. 1, FIG. 2, FIG. 3, FIG. 4, FIG. 5, FIG. 6, and FIG. 7 are like a short hand that is used to describe know functions of certain circuits. Instead of drawing the complete circuits the industry uses these symbols to describe a particular function on a schematic.

The truth tables in FIG. 1a, FIG. 2a, FIG. 3a, FIG. 4a, FIG. 5a, and FIG. 6a, are a mathematical description of the function of how each logic gate functions. The letters at the top of the truth table correspond to inputs and outputs on the circuits with the same labels. The numbers, 1's and 0's, are a universal representation of binary communication. The 1's are logical highs and in this case represent an input or output that is equal to the power source. The 0's are logical lows and in this case represent no input or output or 0 volts.

FIG. 1b is an illustration of a buffer circuit using a single BJT (Bipolar Junction Transistor), Q1. The photodiode, D1 is in it's photoconductive mode or reverse biased and is connected to the base of Q1. When light is applied to the fiber-optic line through input 'A', D1 will connect a positive voltage to the base of Q1 turning it on. Once Q1 is turned on it will connect a positive voltage to the anode of the LED, D2, forward biasing it. Once D2 is forward biased it will turn on and apply light though the fiber-optic lines through output 'Y'. This would prove the truth table in FIG. 1a correct in that every logical high input will yield a logical high output. This design method is applicable to all types of BJT's.

FIG. 1c is an illustration of a buffer circuit using a single FET (Field Effect Transistor), Q1. The photodiode, D1 is in it's photoconductive mode or reverse biased and is connected to the gate of Q1. When light is applied to the fiber-optic line through input 'A', D1 will connect a positive voltage to the gate of Q1 turning it on. Once Q1 is turned on it will connect a positive voltage to the anode of the LED, D2, forward biasing it. Once D2 is forward biased it will turn on and apply light though the fiber-optic lines through output 'Y'. This arrangement would prove the truth table in FIG. 1a correct in that every logical high input will yield a logical high output. This design method is applicable to all types of FET's.

Figure 2A:
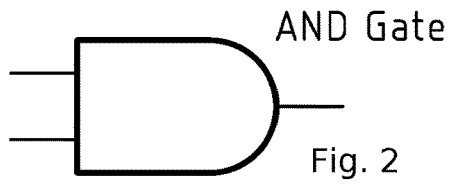
FIG. 2a illustrates the truth table for the AND gate circuit.
Figure 2B:
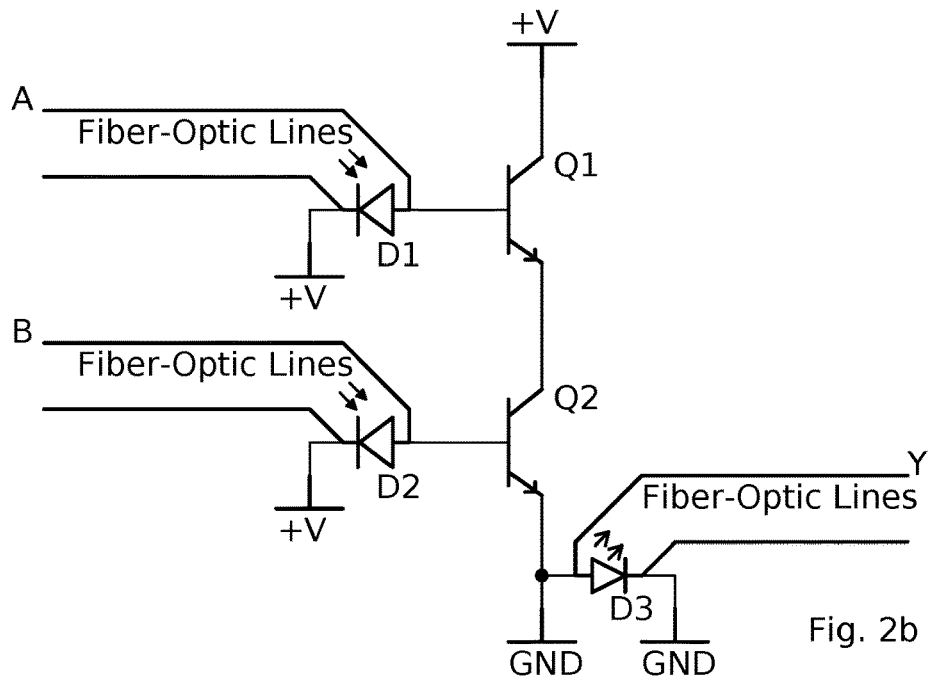
FIG. 2b illustrates the AND gate circuit using two BJT's connected in series.

FIG. 2b is an illustration of an AND gate circuit using more than one BJT (Bipolar Junction Transistor), Q1 and Q2 connected in series from power to ground. The photodiode, D1, is in it's photoconductive mode or reverse biased and is connected to the base of Q1. The photodiode, D2 is in it's photoconductive mode or reverse biased and is connected to the base of Q2. When light is applied to the fiber-optic line through input 'A', D1 will connect a positive voltage to the base of Q1 turning it on. When light is applied to the fiber-optic line through input 'B', D2 will connect a positive voltage to the base of Q2 turning it on. Once both Q1 and Q2 is turned on they will connect a positive voltage to the anode of the LED, D3, forward biasing it. Once D2 is forward biased it will turn on and apply light though the fiber-optic lines through output 'Y'. This arrangement would prove the truth table for an AND gate in FIG. 2a correct in that all logical high inputs will yield a logical high output. This design method includes all types of BJT's.

Figure 2C:
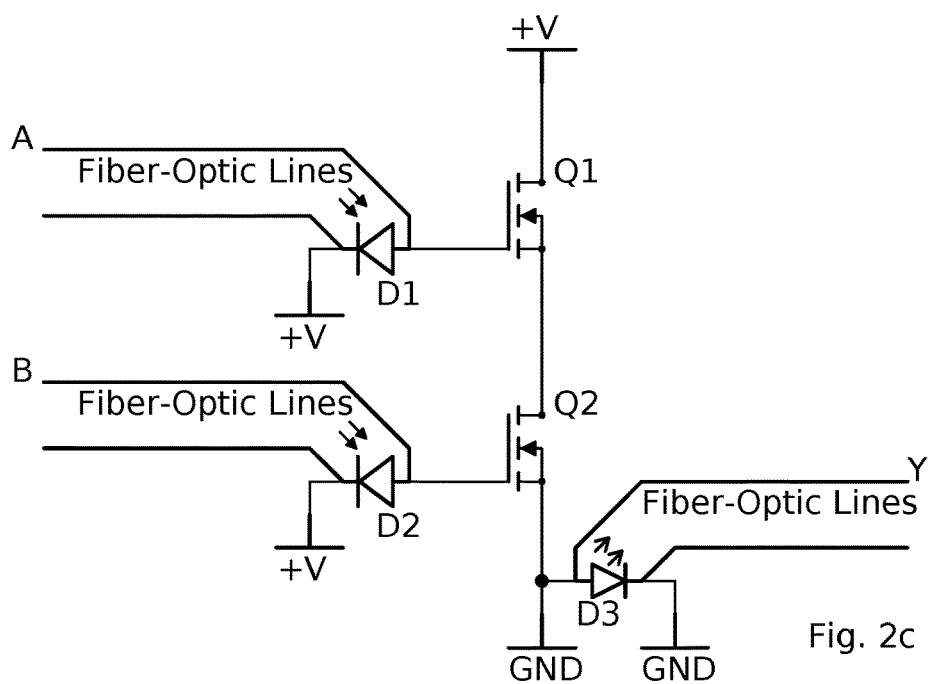
FIG. 2c illustrates the AND gate circuit using two FET's connected in series.

FIG. 2c is an illustration of an AND gate circuit using more than one FET (Field Effect Transistor), Q1 and Q2 connected in series from power to ground. The photodiode, D1, is in it's photoconductive mode or reverse biased and is connected to the gate of Q1. The photodiode, D2 is in it's photoconductive mode or reverse biased and is connected to the gate of Q2. When light is applied to the fiber-optic line through input 'A', D1 will connect a positive voltage to the gate of Q1 turning it on. When light is applied to the fiber-optic line through input 'B', D2 will connect a positive voltage to the gate of Q2 turning it on. Once both Q1 and Q2 is turned on they will connect a positive voltage to the anode of the LED, D3, forward biasing it. Once D2 is forward biased it will turn on and apply light though the fiber-optic lines through output 'Y'. This arrangement would prove the truth table for an AND gate in FIG. 2a correct in that all logical high inputs will yield a logical high output. This design method includes all types of FET's.

FIG. 3b is an illustration of an OR gate circuit using more than one BJT (Bipolar Junction Transistor), case Q1 and Q2 connected in parallel from power to ground. The photodiode, D1, is in it's photoconductive mode or reverse biased and is connected to the base of Q1. The photodiode, D2 is in it's photoconductive mode or reverse biased and is connected to the base of Q2. When light is applied to the fiber-optic line through input 'A', D1 will connect a positive voltage to the base of Q1 turning it on. When light is applied to the fiber-optic line through input 'B', D2 will connect a positive voltage to the base of Q2 turning it on. Once either Q1 or Q2 is turned on they will connect a positive voltage to the anode of the LED, D3, forward biasing it. Once D2 is forward biased it will turn on and apply light though the fiber-optic lines through output 'Y'. This arrangement would prove the truth table for an OR gate in FIG. 3a correct in that any logical high input will yield a logical high output. This design method includes all types of BJT's.

FIG. 3c is an illustration of an OR gate circuit using more than one FET (Field Effect Transistor), Q1 and Q2 connected in parallel from power to ground. The photodiode, D1, is in it's photoconductive mode or reverse biased and is connected to the gate of Q1. The photodiode, D2 is in it's photoconductive mode or reverse biased and is connected to the gate of Q2. When light is applied to the fiber-optic line through input 'A', D1 will connect a positive voltage to the gate of Q1 turning it on. When light is applied to the fiber-optic line through input 'B', D2 will connect a positive voltage to the gate of Q2 turning it on. Once either Q1 or Q2 is turned on they will connect a positive voltage to the anode of the LED, D3, forward biasing it. Once D2 is forward biased it will turn on and apply light though the fiber-optic lines labeled output 'Y'. This arrangement would prove the truth table for an OR gate in FIG. 3a correct in that any logical high input will yield a logical high output. This design method includes all types of FET's.

FIG. 4b is an illustration of a inverter or (NOT gate) circuit using a single BJT (Bipolar Junction Transistor), Q1. The photodiode, D1 is in it's photoconductive mode or reverse biased and is connected to the base of Q1. When light is applied to the fiber-optic line through input 'A', D1 will connect a positive voltage to the base of Q1 turning it on. Once Q1 is turned on it will shunt current away from the LED, D2, turning it off. Once D2 is off it will not apply light though the fiber-optic lines labeled output 'Y'. This would prove the truth table in FIG. 4a correct in that every logical high input will yield a logical low output. This design method is applicable to all types of BJT's.

FIG. 4c is an illustration of an inverter or (NOT gate) circuit using a single FET (Field Effect Transistor), Q1. The photodiode, D1 is in it's photoconductive mode or reverse biased and is connected to the gate of Q1. When light is applied to the fiber-optic line through input 'A', D1 will connect a positive voltage to the gate of Q1 turning it on. Once Q1 is turned on it will shunt current away from the LED, D2, turning it off. Once D2 is off it will not apply light though the fiber-optic lines labeled output 'Y'. This would prove the truth table in FIG. 4a correct in that every logical high input will yield a logical low output. This design method is applicable to all types of FET's.

Figure 5A:
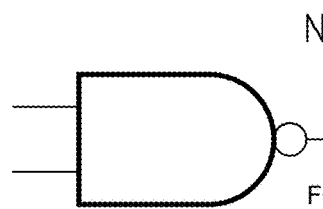
FIG. 5a illustrates the truth table for the NAND gate circuit.
Figure 5B:
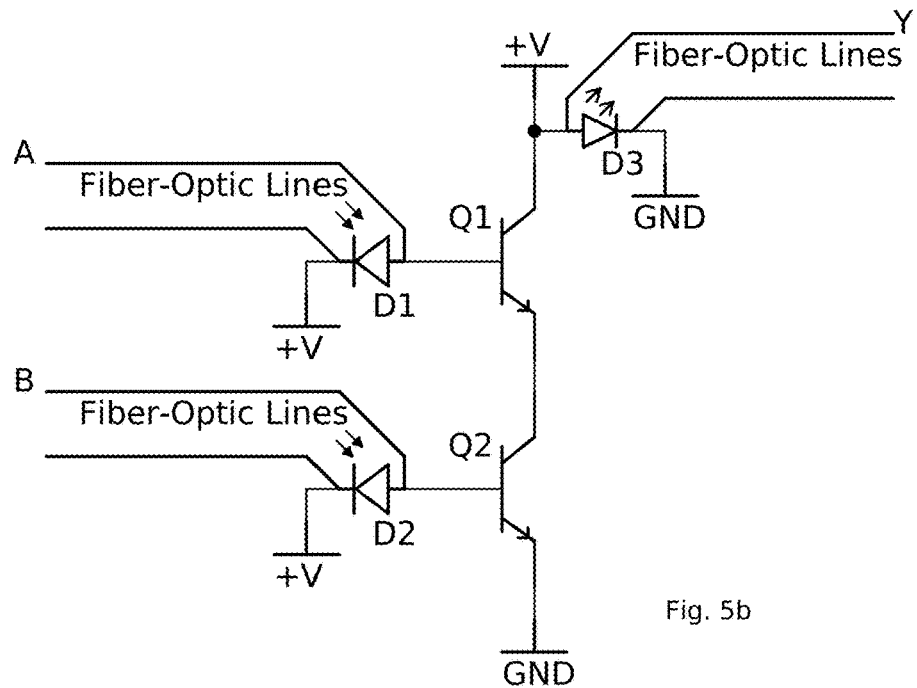
FIG. 5b illustrates the NAND gate circuit using two BJT's connected in series.

FIG. 5b is an illustration of a NAND gate circuit using more than one BJT (Bipolar Junction Transistor), Q1 and Q2 connected in series from power to ground. The photodiode, D1, is in it's photoconductive mode or reverse biased and is connected to the base of Q1. The photodiode, D2 is in it's photoconductive mode or reverse biased and is connected to the base of Q2. When light is applied to the fiber-optic line through input 'A', D1 will connect a positive voltage to the base of Q1 turning it on. When light is applied to the fiber-optic line through input 'B', D2 will connect a positive voltage to the base of Q2 turning it on. Once both Q1 and Q2 is turned on they will shunt current away from the LED, D3, turning it off. If D3 is off it will not apply light though the fiber-optic lines labeled output 'Y'. This arrangement would prove the truth table for an NAND gate in FIG. 5a correct in that all logical high inputs will yield a logical low output. This design method includes all types of BJT's.

Figure 5C:
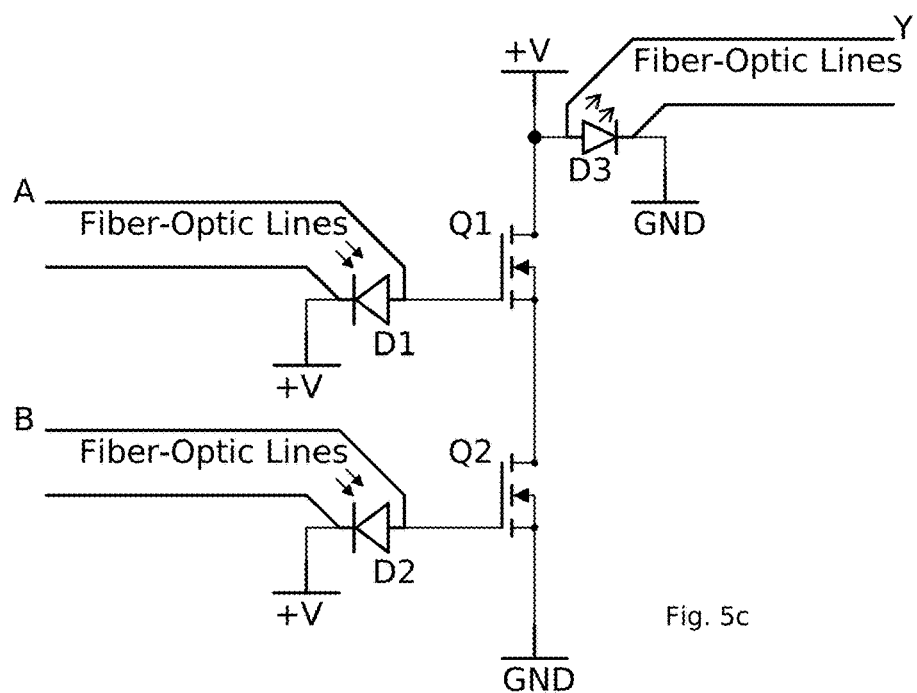
FIG. 5c illustrates the NAND gate circuit using two FET's connected in series.

FIG. 5c is an illustration of a NAND gate circuit using more than one FET (Field Effect Transistor), Q1 and Q2 connected in series from power to ground. The photodiode, D1, is in it's photoconductive mode or reverse biased and is connected to the gate of Q1. The photodiode, D2 is in it's photoconductive mode or reverse biased and is connected to the gate of Q2. When light is applied to the fiber-optic line through input 'A', D1 will connect a positive voltage to the gate of Q1 turning it on. When light is applied to the fiber-optic line through input 'B', D2 will connect a positive voltage to the gate of Q2 turning it on. Once both Q1 and Q2 is turned on they will shunt current away from the LED, D3, turning it off. If D3 is off it will not apply light though the fiber-optic lines labeled output 'Y'. This arrangement would prove the truth table for an NAND gate in FIG. 5a correct in that all logical high inputs will yield a logical low output. This design method includes all types of FET's.

FIG. 6b is an illustration of an NOR gate circuit using more than one BJT (Bipolar Junction Transistor), Q1 and Q2 connected in parallel from power to ground. The photodiode, D1, is in it's photoconductive mode or reverse biased and is connected to the base of Q1. The photodiode, D2 is in it's photoconductive mode or reverse biased and is connected to the base of Q2. When light is applied to the fiber-optic line through input 'A', D1 will connect a positive voltage to the base of Q1 turning it on. When light is applied to the fiber-optic line through input 'B', D2 will connect a positive voltage to the base of Q2 turning it on. Once either Q1 or Q2 is turned on they will shunt current away from the LED, D3, turning it off. Once D3 is off it will not apply light though the fiber-optic lines labeled output 'Y'. This arrangement would prove the truth table for an OR gate in FIG. 5a correct in that any logical high input will yield a logical low output. This design method includes all types of BJT's.

FIG. 6c is an illustration of an NOR gate circuit using more than one FET (Field Effect Transistor), Q1 and Q2 connected in parallel from power to ground. The photodiode, D1, is in it's photoconductive mode or reverse biased and is connected to the gate of Q1. The photodiode, D2 is in it's photoconductive mode or reverse biased and is connected to the gate of Q2. When light is applied to the fiber-optic line through input 'A', D1 will connect a positive voltage to the gate of Q1 turning it on. When light is applied to the fiber-optic line through input 'B', D2 will connect a positive voltage to the gate of Q2 turning it on. Once either Q1 or Q2 is turned on they will shunt current away from the LED, D3, turning it off. Once D3 is off it will not apply light though the fiber-optic lines labeled output 'Y'. This arrangement would prove the truth table for an OR gate in FIG. 6a correct in that any logical high input will yield a logical low output. This design method includes all types of FET's.

Figure 7B:
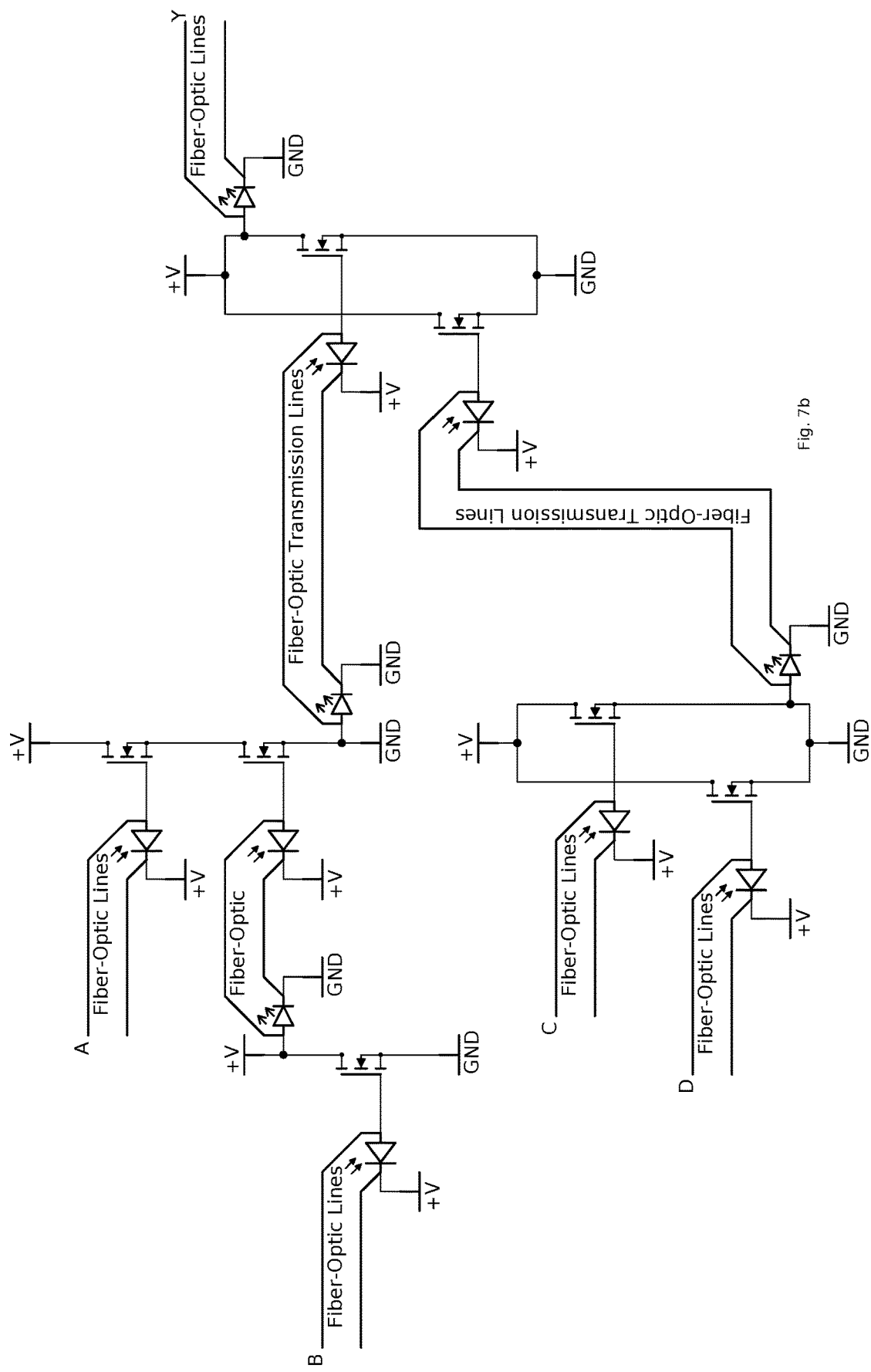
FIG. 7b illustrates a detailed schematic of how the logic gates would connect to each other using FET transistors.

As seen in FIG. 7a illustrates how the logic gates themselves will connect to each other by fiber-optic transmission lines using BJT's. FIG. 7b illustrates how the logic gates themselves will connect to each other by fiber-optic transmission lines using FET's. enabling the design of faster, more efficient, and less error prone integrated circuits. Each of them have inputs labeled 'A', 'B', 'C', and 'D' and an output labeled 'Y'. These illustrations are examples of connections between logic circuits and not actual logic gates themselves.

I claim:

1. A logic circuit comprising:
    a plurality of logic gates;
    a first of the plurality logic gates further comprising a first bipolar junction transistor (BJT) having a first BJT base, a first BJT emitter and a first BJT collector, and a first photodiode having a first photodiode cathode and a first photodiode anode attached to the first BJT base;
    a second of the plurality of logic gates further comprising a second BJT having a second BJT base, a second BJT emitter, and a second BJT collector, and a second photodiode attached to the second BJT base;
    wherein light through a first fiber-optic line turns on the first photodiode and connects a first positive voltage to the first BJT base;
    a first light emitting diode (LED) having a first LED cathode and a first LED anode attached to an output of the first logic gate for transmitting light through a second fiber-optic line to the second photodiode of the second logic gate;
    fiber-optic transmission lines for connecting the plurality of logic gates within the logic circuit and transmitting binary information in the form of light between the plurality of logic gates within the logic circuit.

2. The logic circuit of claim 1, wherein the photodiodes convert the binary information in the form of light into binary information in the form of electronic pulses to be processed by the BJTs.

3. The logic circuit of claim 1, wherein the first LED converts the binary information in the form of electronic pulses that have been processed by the first BJT into light.

4. The logic circuit of claim 1, wherein the fiber optic transmission lines are used as a transmission medium for the binary information in the form of light connecting an LED of a logic gate to a photodiode of a following logic gate within the logic circuit.

5. A logic circuit comprising:
    a plurality of logic gates;
    a first of the plurality logic gates further comprising a first field-effect transistor (FET) having a first FET gate, a first FET source and a first FET drain, and a first photodiode having a first photodiode cathode and a first photodiode anode attached to the first FET gate;
    a second of the plurality of logic gates further comprising a second FET having a second FET gate, a second FET source, and a second FET drain, and a second photodiode attached to the second FET gate;
    wherein light through a first fiber-optic line turns on the first photodiode and connects a first positive voltage to the first FET gate;
    a first light emitting diode (LED) having a first LED cathode and a first LED anode attached to an output of the first logic gate for transmitting light through a second fiber-optic line to the second photodiode of the second logic gate;
    fiber-optic transmission lines for connecting the plurality of logic gates within the logic circuit and transmitting binary information in the form of light between the plurality of logic gates within the logic circuit.

6. The logic circuit of claim 1, wherein the photodiodes convert the binary information in the form of light into binary information in the form of electronic pulses to be processed by the FETs.

7. The logic circuit of claim 1, wherein the first LED converts the binary information in the form of electronic pulses that have been processed by the first FET into light.

8. The logic circuit of claim 1, wherein the fiber optic transmission lines are used as a transmission medium for the binary information in the form of light connecting an LED of a logic gate to a photodiode of a following logic gate within the logic circuit.

* * * * *